United States Patent [19]
Dunlap et al.

[11] Patent Number: 5,748,533
[45] Date of Patent: May 5, 1998

[54] READ CIRCUIT WHICH USES A COARSE-TO-FINE SEARCH WHEN READING THE THRESHOLD VOLTAGE OF A MEMORY CELL

[75] Inventors: Frank M Dunlap, Palo Alto; Hock C. So, Redwood City; Sau C. Wong, Hillsborough, all of Calif.

[73] Assignee: inVoice Technology, Inc., Santa Clara County, Calif.

[21] Appl. No.: 622,332

[22] Filed: Mar. 26, 1996

[51] Int. Cl.$^6$ ................................................ G11C 11/34
[52] U.S. Cl. ........................... 365/185.19; 365/185.03; 365/185.23; 365/230.06
[58] Field of Search .................... 365/185.19, 185.01, 365/185.03, 185.23, 230.06, 185.18

[56] References Cited

U.S. PATENT DOCUMENTS

| | | | |
|---|---|---|---|
| 5,128,895 | 7/1992 | Park | 365/185.19 |
| 5,487,033 | 1/1996 | Keeney et al. | 365/185.03 |

*Primary Examiner*—David C. Nelms
*Assistant Examiner*—F. Niranjan
*Attorney, Agent, or Firm*—Skjerven, Morrill, MacPherson, Franklin & Friel; Alan H. MacPherson; David T. Millers

[57] ABSTRACT

A read circuit includes a driver which changes a gate voltage of a memory cell and a sense circuit which identifies when the memory cell trips. The driver searches for the threshold voltage of the memory cell using stages which ramp up gate voltage and stages which ramp down the gate voltage. Each stage ends when the sense circuit senses that the memory cell trips, i.e. begins or stops conducting. Initial stages of the search have high ramp rates so that the gate voltage reaches the threshold voltage. These initial stages can give inaccurate threshold voltage readings because high ramp rates change the gate voltage during the period between the transistor tripping and sensing the trip. Later stages ramp the gate voltage slowly to provide an accurate threshold voltage reading. The low ramp rate of the last stage provides accuracy, and the high ramp rate of the initial stages reduces read time. To further reduce read time, the search process can begin at a median voltage for possible threshold voltages.

25 Claims, 7 Drawing Sheets

READ CIRCUIT WHICH USES A COARSE-TO-FINE SEARCH WHEN READING THE THRESHOLD VOLTAGE OF A MEMORY CELL

BACKGROUND OF THE INVENTION

1. Field of the Invention

This invention relates to circuits and methods for reading the threshold voltage of a transistor and to read circuits for analog and multi-level memory.

2. Description of Related Art

U.S. patent application Ser. No. 08/333,381, entitled "High Resolution Analog Storage EPROM and Flash EPROM", by Sau. C Wong and Hock C. So, filed Nov. 2, 1994 describes analog memory and is incorporated by reference herein in its entirety. One embodiment of the memory described in the incorporated patent application contains a read circuit which slowly ramps the gate voltage of a floating gate transistor in a memory cell and senses when the memory cell begins to conduct a current. The gate voltage when the memory cell begins to conduct indicates the threshold voltage of the memory cell and thus an analog value stored in the memory cell as the threshold voltage.

The accuracy of the analog value read depends on the rate at which the gate voltage is ramped and the speed and sensitivity of circuitry which senses whether a memory cell conducts. To improve accuracy, the gate voltage is ramped slowly so that the gate voltage changes very little between the memory cell beginning to conduct and sensing that the memory cell conducts. However, slow ramping rates require more time to reach the threshold voltage of the cell which increases the read times for the memory. A faster read circuit which still maintains high accuracy is desired.

SUMMARY OF THE INVENTION

In accordance with the invention, a read circuit includes a word line driver which ramps a gate voltage of a selected memory cell up or down in stages during a read process. Each stage ramps the gate voltage in one direction and ends when a sense circuit generates a signal indicating that the selected memory cell has tripped, i.e. stopped or started conducting. The gate voltage at the end of each stage differs from a trip point for the memory cell by an amount that depends on the time required to sense that the selected memory cell has tripped and the rate at which the gate voltage changes. The early stages of the read process have relatively high ramp rates so that the gate voltage quickly changes enough to cause the selected memory cell to trip. The high ramp rates cause the early stages to end at gate voltages which are inaccurate measures of the trip point. Later stages, particularly the last stage, have low ramp rates and end at an accurate measure of the trip point, so that the gate voltage at the end of the last stage accurately indicates the threshold voltage of, and the value stored in a memory cell.

The combination of higher ramp rates at the start of a read and lower ramp rates at the end of the read provides a lower average read time because the lower ramp rates, which control the accuracy of the read process, only change the gate voltage by a small amount from the approximate readings provided by earlier stages. To further reduce the average and maximum read times, the gate of the selected cell can be charged to a voltage which is the median for a range of possible trip points for the selected memory cell. This reduces read time by cutting in half the maximum gate voltage change required to reach the trip point.

In accordance with an aspect of the invention, a read circuit which includes a driver, a sense circuit, and a ramp control circuit implements the read process to read memory cells in an analog memory or a multi-level memory where the threshold voltage of a memory cell indicates an analog value or a multi-bit digital value, respectively. The read process may be conducted for a fixed number of stages where the read time depends on the time required to complete all of the stages or where the read time is fixed the value obtained after the fixed number of stages is held until the end of the read time. Alternatively, the read process with a fixed read time has a variable number of completed stages; and during the last stages, a very low ramp rate keeps the gate voltage within a small range of the trip point of the selected memory cell.

The gate voltage at the end of the last stage is sampled and used to determine the value stored in the selected memory cell. The sampled gate voltage, which indicates the trip point to an accuracy determined by the ramp rate of the last stage, differs somewhat from the absolute threshold voltage of the selected cell but accurately indicates the relative threshold voltage of the selected memory cell and the value stored in the selected memory cell.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, a method for reading the threshold voltage of a transistor proceeds in a series of stages. Each stage ramps (i.e. changes) the transistor's gate voltage in a direction and at a rate or rates selected for the stage and ends after the change in gate voltage causes the transistor to cross a trip point where the transistor turns on or off. The direction and magnitude of ramping are selected so that each stage ramps the gate voltage in the opposite direction from the preceding stage and ramp rates in later stages are generally lower than ramp rates in the earlier stages.

Figure 1A:
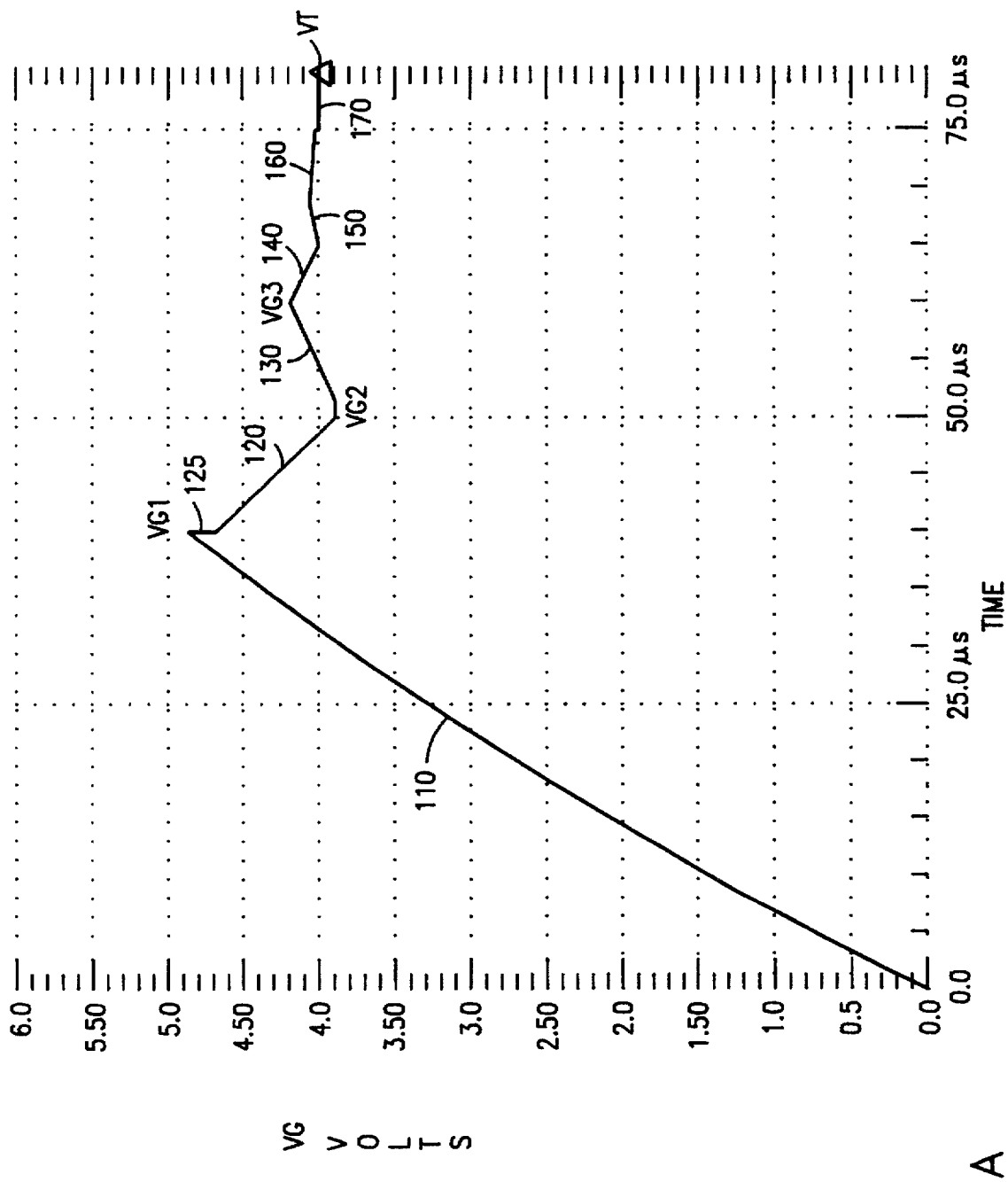
FIGS. 1A and 1B show plots of gate voltages applied to a transistor when using read processes in accordance with embodiments of the invention to read the threshold voltage of the transistor.

FIG. 1A shows an example of an N-channel transistor's gate voltage VG during a coarse-to-fine search process which reads the transistor. Read processes for P-channel are similar and will be apparent in view of the following description. Initially, gate voltage VG and a source voltage VS for the transistor are zero, and the transistor is off. During a first stage 110 of the read process, gate voltage VG is ramped up at a rate of about $1.4 \times 10^5$ volts/second. A constant current of about 2.0 µA applied to a total capacitance of 14 pF, for example, would ramp up the gate voltage at $1.4 \times 10^5$ volts/second. When gate voltage of the transistor passes the threshold voltage VT of the transistor the transistor turns on. Stage 110 continues until the after the turning on of the transistor is sensed. Accordingly, gate voltage VG continues moving up during a finite response time required to sense the transistor turning on and overshoots the trip point and the threshold voltage VT by an amount that depends on the ramping rate and the sensing time. The gate voltage VG ends stage 110 at a voltage VG1 which is greater than threshold voltage VT.

A second stage of the read process 120 begins when stage 110 ends. During stage 120, gate voltage VG is ramped down. When gate voltage VG is below threshold voltage VT, the transistor turns off (trips again). Stage 120 ends when tripping of the transistor is sensed which occurs after the gate voltage crosses the threshold voltage of the transistor. In the process illustrated in FIG. 1, stage 120 ramps gate voltage VG down at about the same rate that voltage VG was ramped up during first stage 110, about $1.4 \times 10^5$ volts/second. However, in stage 120, the delay between tripping and sensing may be less than the delay in stage 110 because during stage 120, a sense circuit is charged to a level closer to the trip point. If the sensing time is decreased for stage 120, stage 120 ends at a gate voltage VG2 which is closer to threshold voltage VT than is voltage VG1.

During a third stage 130, ramping is reversed in direction from the preceding stage 120 and reduced in magnitude to about $7 \times 10^4$ volts/second. The slower ramping during stage 130 when compared to stage 110 and 120 provides less overshoot than occurred during stages 110 and 120, and a gate voltage VG3 at the end of stage 130 is closer to threshold voltage VT than is gate voltage VG1 or VG2.

Subsequent stages 140, 150, 160, and 170 each reverses ramp direction from the preceding stage 130, 140, 150, and 160 respectively. The later stages uses lower ramp rates and end at gate voltages which converge on the trip point for the transistor. Stage 170, which is the last stage, uses the lowest ramp rate less than about $2 \times 10^4$ volts/second. An advantage of the read process shown in FIG. 1A is that the final reading has an accuracy which is determined by the ramp rate of stage 170. However, during the preceding stages, higher ramp rates more quickly drive gate voltage VG to the threshold level. Accordingly, the read process of FIG. 1A can take considerably less time than a read process which used a constant ramp rate equal to the ramp rate of step 170.

In the process of FIG. 1A, the ramp rate is reduced by about half about every other stage. An alternative process reduces the ramp rate each stage. However, many patterns for reducing ramp rates may be employed. For example, the ramp rate may be reduced proportionally for each successive stage, for example, by one half, one third, or one fourth, or reduced irregularly with large (or small) reductions in early stages and small (or large) reductions in late stages. Additionally, the ramp rate may be changed during a stage. Alternatively, the ramp rate is held constant which causes the gate voltage to oscillate around the trip point being read, and a filter is used to extract the trip point from the oscillating signal. As still another alternative, ramping is stopped entirely after a stage which determines the trip point to a desired accuracy, and capacitance in the system holds the measured voltage for later sampling.

Ideally, ramp rate reductions are selected to minimize the read time required to provide the desired accuracy. Minimization of read time depends on the starting point of the gate voltage, the range of possible threshold voltages which can be read, the maximum usable ramp rate, the minimum ramp rate (i.e. the desired accuracy), and the times required to sense the ends of the stages.

Figure 1B:
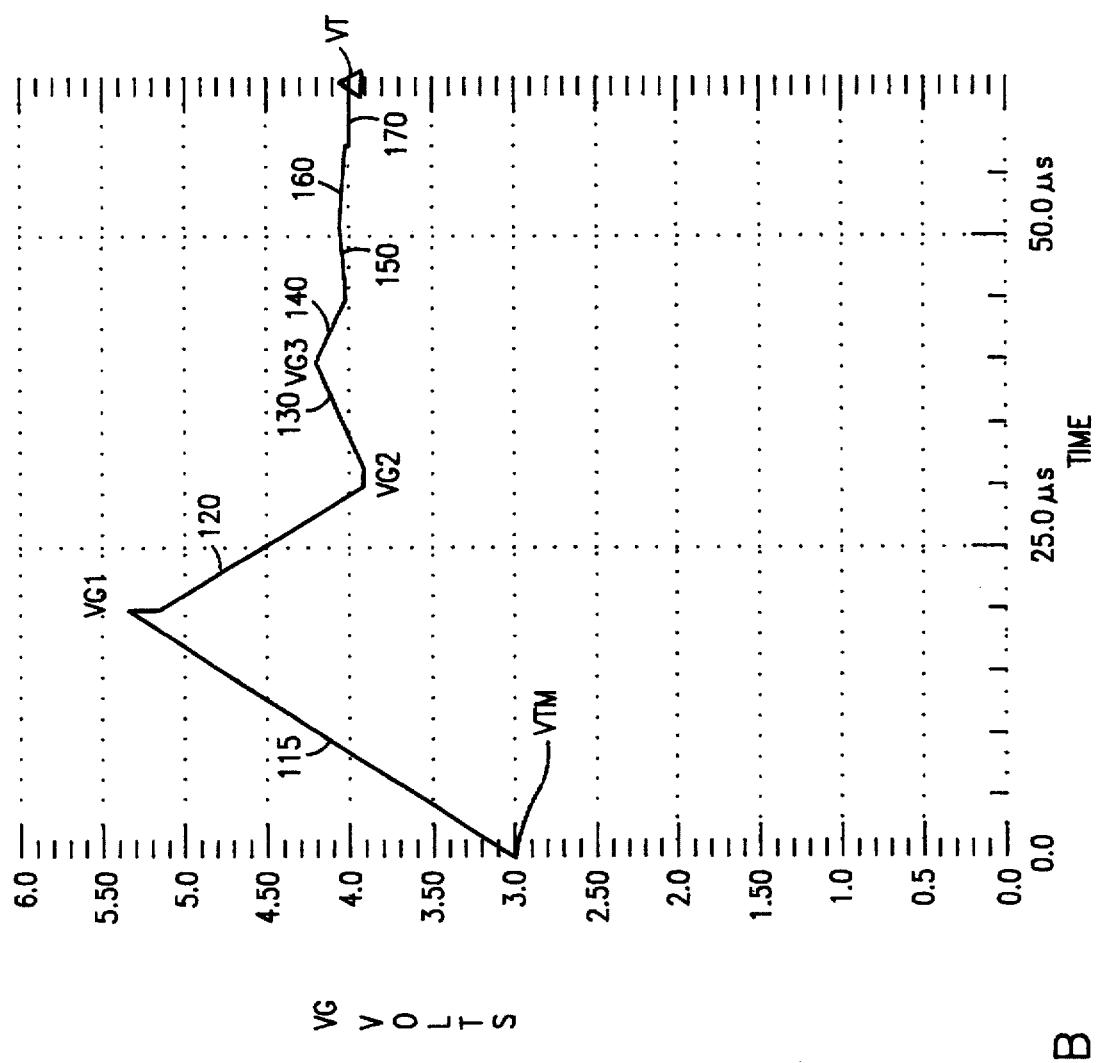

In a worst case for the processes of FIG. 1A, first stage 110 ramps gate voltage VG from 0 volts to the highest possible threshold voltage, for example up to 6 volts. The worst case provides the longest read time and increases the amount of time which must be allotted for each read. FIG. 1B shows a read process which reduces the worst case read time. In the process of FIG. 1B, gate voltage VG is initially charged to a voltage level VTM which is the mean of possible threshold voltages or trip points. The initial charging of gate voltage VG to voltage level VTM may be done quickly using a power supply. Once the gate is initially charged, whether the transistor conducts at voltage VTM is sensed, and a ramping direction for a first stage 115 is selected to drive voltage VG toward the trip point. In FIG. 1B, threshold voltage VT is greater than voltage VTM so that the transistor initially does not conduct and ramping up is selected for stage 115. If the transistor initially conducted, stage 115 would ramp gate voltage VG down.

Starting the process at voltage VTM, the middle of the range of possible ending gate voltages, reduces the average and the worst case read times because the maximum difference between VTM and a possible threshold voltage is half the range of possible threshold voltages and initial ramping stage 115 takes less time. After the initial stage 115, the read process of FIG. 1B proceeds as described above for the process of FIG. 1A.

Figure 2:
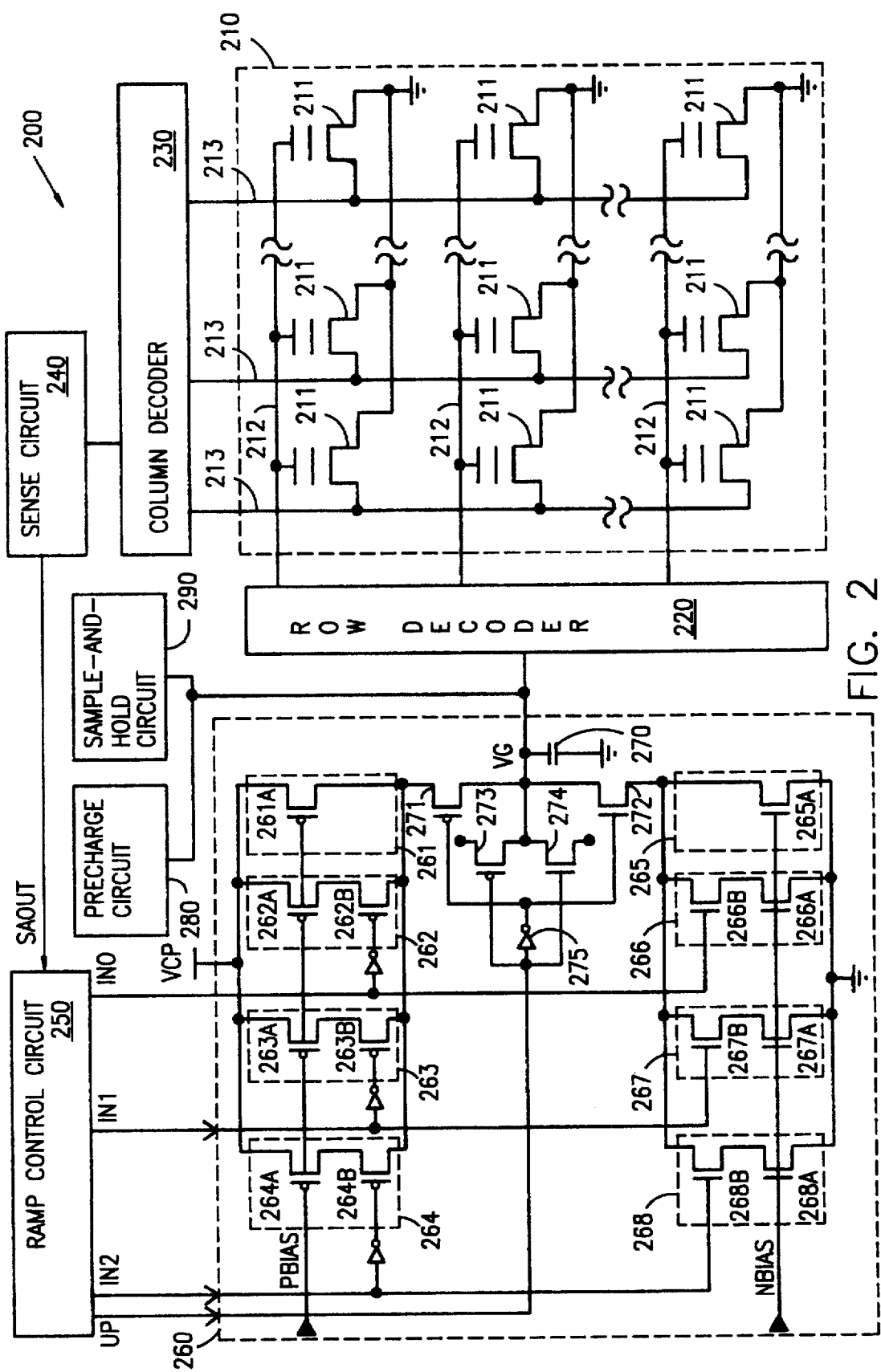
FIG. 2 shows a portion of a memory in accordance with an embodiment of the invention.

FIG. 2 shows a portion of an analog memory 200 which includes a read circuit in accordance with an embodiment of the invention. Memory 200 contains an array 210 of N rows and M columns of memory cells 211 which a row decoder 220 and a column decoder 230 connect to the read circuit during a read. The read circuit includes a sense circuit 240, a ramp control circuit 250, and a word line driver 260. Write circuits and input/output interfaces which are components of memory 200 are well known in the art and are not shown in FIG. 2. Memory cells 211 can be floating gate transistors, metal nitride oxide silicon (MNOS) transistors, or split gate memory cells, each having a single accessible gate and a threshold voltage which indicate a value stored. Alternative embodiments of the invention employ multiple transistor memory cells which have separate select gates (not shown) and control gates.

In still other alternative embodiments, memory 200 is a multilevel memory which stores multiple bits of information in each memory cell 211. A multilevel memory provides a digital-to-analog conversion when writing a digital value as a threshold voltage of a memory cell, and an analog-to-digital conversion of a threshold voltage read from a memory cell.

Each word line 212 in memory array 210 is connected to the control gates of a row of memory cells 211 and to row decoder 220. When reading a selected one of memory cells 211, row decoder 220 connects word line driver 260 to a selected one of word lines 212 which is connected to the control gate of the selected memory cell. The remaining unselected word lines are grounded. Row decoders such as row decoder 220 which select a row indicated by an address signal are well known in the art.

Initially, the selected word line is charge to the desired starting point of the search by a precharge circuit 280. The starting point of the search may be the lowest possible threshold voltage, the midpoint of the range of possible threshold voltages, the highest possible threshold voltage, the ground potential, the supply voltage Vcc, or any other desired voltage. In a first stage of a coarse-to-fine search, word line driver 260 ramps a voltage VG, the voltage on the selected word line, towards the threshold voltage of the selected memory cell. Memory cells 211 are N-channel devices having source lines which are grounded, so that when voltage VG is greater than the threshold voltage of the selected memory cell the selected memory cell turns on.

Each bit line 213 in memory array 210 is connected to the drains of a column of memory cells 211 and to column decoder 230. During reading of the selected memory cell, column decoder 230 connects sense circuit 240 to a selected one of bit lines 213 which is connected to the drain of the selected memory cell. Sense circuit 240 senses whether any memory cell 211 connected to the selected bit line conducts. A digital signal SAOUT from sense circuit 240 is high if no memory cell connected to the selected bit line conducts and low if sense circuit 240 senses that the selected memory cell conducts.

Ramp control circuit 250 monitors signal SAOUT. When signal SAOUT is high, ramp control circuit 250 asserts a signal UP, and word line driver 260 ramps up voltage VG. When signal SAOUT is low, ramp control circuit 250 deasserts a signal UP, and word line driver 260 ramps down voltage VG. Accordingly, each time the selected memory cell trips, sense circuit 240 changes signal SAOUT and word line driver 260 reverses the direction of ramping.

In memory 200, word line driver 260 contains pull-up circuits 261 to 264 which a P-channel transistor 271 connects to a capacitor 270 when signal UP is asserted. Capacitor 270 is added to slow the ramping rate and typically has a capacitance of about 10 to 100 pF which dominates a typical word line capacitance of a few pF. An N-channel transistor 272 connects pull-down devices 265 to 268 to capacitor 270 when signal UP is deasserted.

At the end of each stage in a read process, signal UP switches from high to low or low to high. This switching can cause a rapid change in voltage VG because changes in signal UP pass through the gate capacitance of transistors 271 and 272. For example, in FIG. 1A, the beginning of stage 120 includes a rapid drop 125 in the gate voltage caused by signal UP dropping from supply voltage Vcc to ground. In word line driver 260, transistors 273 and 274 have gate voltages which are complementary to the gate voltages of transistors 271 and 272 so that switching of the gate voltages of transistors 273 and 274 oppose changes caused by switching of the gate voltages of transistors 271 and 272. The gate capacitance of transistors 273 and 274 can be selected to match respective transistors 271 and 272, to nearly eliminate changes in voltage VG caused by changing signal UP.

The magnitude of the current which charges or discharges capacitor 270 depends on which of pull-up circuits 261 to 264 or pull-down circuits 265 to 268 are disabled. Ramp control circuit 250 generates signals IN0, IN1, and IN2 to selectively disable none, some, or all of pull-up circuits 262 to 264 or pull-down circuits 266 to 268. When signals UP, IN0, IN1, and IN2 enable all of pull-up circuits 261 to 264, voltage VG ramps up at a maximum rate controlled which is the sum of the currents through pull-up circuits 261 to 264. If signal Up is deasserted and all of pull-down circuits 265 to 268 are enabled, voltage VG ramps down at a maximum rate. In late stages of the read process, ramp control circuit 250 changes signals IN0, IN1, and IN2 to disable some or all of pull-up circuits 262 to 264 or pull-down circuits 266 to 268 and reduce the ramp rate.

The amount of current through each of circuits 261 to 268 depends on the size of P-channel transistors 261A to 264A and N-channel transistors 265A to 268A. P-channel transistors 261A to 264A are connected to a voltage VCP which is greater than the maximum threshold voltage of memory cells 211 and have bias voltage PBIAS applied to their gates. N-channel transistors 265A to 268A are connected to ground and have bias voltage NBIAS are applied to their gates. Each of circuits 262 to 264 and 266 to 268 is individually enabled or disabled by turning on or off a corresponding one of transistors 262B to 264B and 266B to 268B. Circuits 261 and 265 are enabled or disabled solely by transistors 271 and 272.

In one embodiment of the invention, pull-up circuit 261 is not present, and each pull-up circuit 262 to 264 supplies a different amount of current depending on the size of transistors 262A to 264A. For example, pull-up circuit 262 provides the smallest current, pull-up circuit 263 provides three times the current provided by pull-up circuit 262, and pull-up circuit 264 provides twelve times the current of pull-up circuit 262. If all of signals IN0, IN1, and IN2 are asserted high, a total current, which is sixteen times the current through pull-up circuit 262, ramps up the gate voltage VG. Deasserting signal IN2 drops the ramping rate by a factor of four, and deasserting signals IN2 and IN1 decreases the ramping rate by a factor of sixteen.

Figure 3:
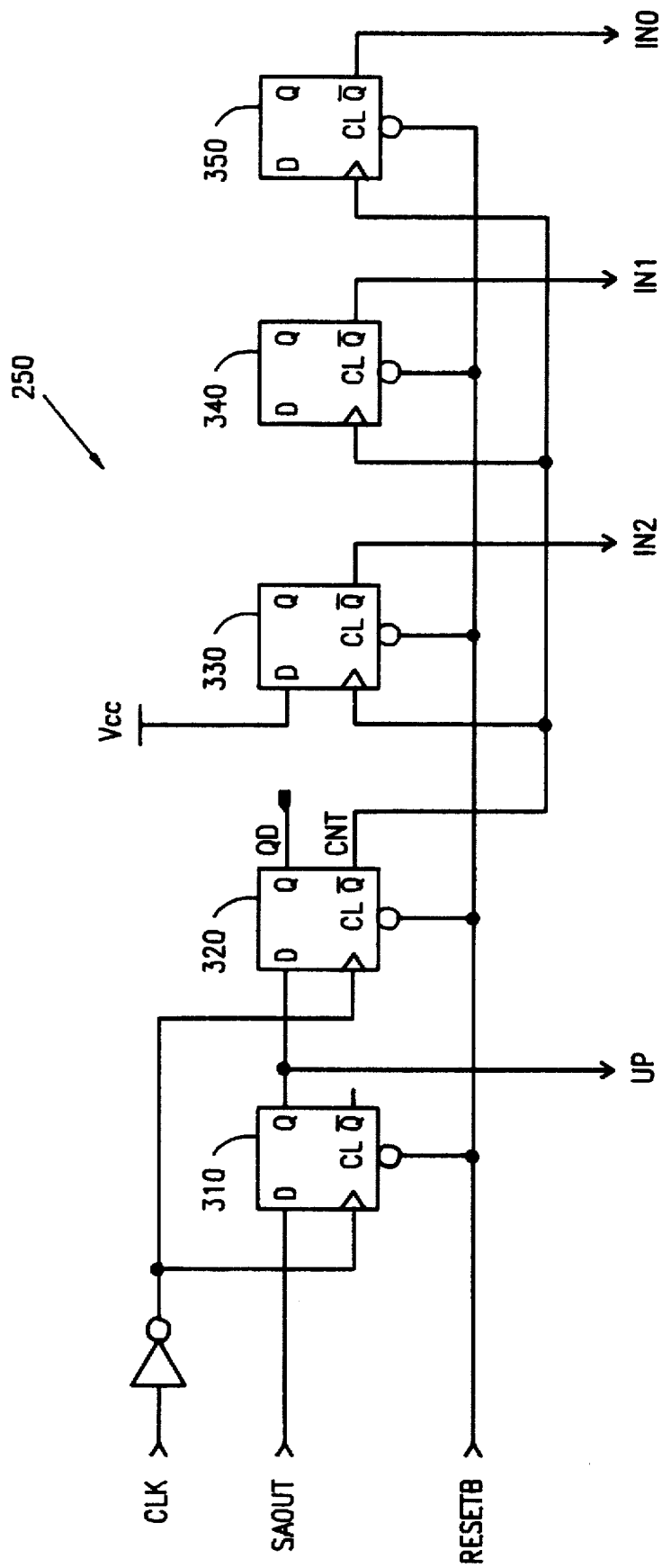
FIG. 3 shows a ramp control circuit for a read circuit in the memory shown in FIG. 2.

FIG. 3 shows an embodiment of ramp control circuit 250. Ramp control circuit 250 contains flip-flops 310, 320, 330, 340, and 350. Signal SAOUT from the sense circuit is applied to a data input terminal of flip-flop 310, and a non-inverted output terminal of flip-flop 310 is coupled to the data input terminal of flip-flop 320. A signal CLK clocks flip-flops 310 and 320. A signal CNT from an inverted output terminal of flip-flop 320 clocks flip-flops 330, 340, and 350 which are connected together with a non-inverted output terminal of flip-flop 330 coupled to a data input terminal of flip-flop 340 and a non-inverted output terminal of flip-flop 340 coupled to a data input terminal of flip-flop 350. Output signals UP, IN2, IN1, and IN0 are respectively from a non-inverted output terminal of flip-flop 310 and inverted output terminals of flip-flops 330, 340, and 350.

Figure 4:
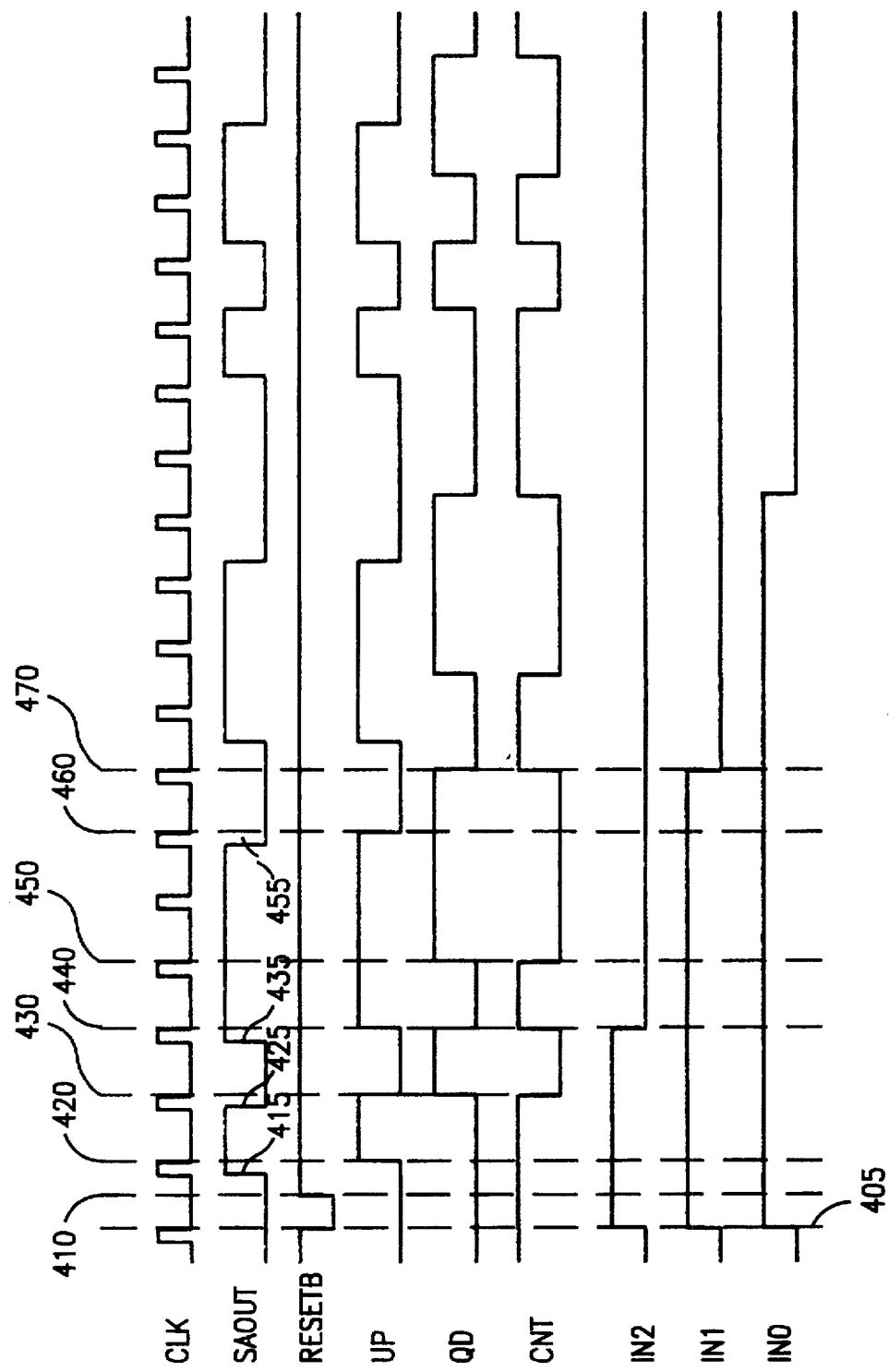
FIG. 4 shows timing diagrams for signals generated in the ramp control circuit of FIG. 3.

FIG. 4 shows timing diagrams of signals in ramp control circuit 250 of FIG. 3 during a read process which is begun at time 405 when a signal RESETB is asserted low to reset or clear flip-flops 310, 320, 330, 340, and 350. Resetting the flip-flops causes signals UP, IN2, IN1, and IN0 to be low, high, high, and high respectively so that word line driver 260 drives the selected word line toward ground. Sense circuit 240 is then activated and assets signal SAOUT high at time 415 to indicate that the selected memory cell does not conduct. At time 420, an edge of signal CLK triggers flip-flop 310 which asserts signal UP to begin ramping up voltage VG. Flip-flop 320 is also triggered at time 420, but signal CNT does not change because the signal at the data input terminal of flip-flop 320 at time 420 is low.

Ramping up continues until after time 425 when sense circuit 240 senses that the selected memory cell has tripped. In particular, at time 430, another edge of signal CLK triggers flip-flop 310 which deasserts signal UP to begin ramping down voltage VG. Flip-flop 320 deasserts signal CNT at time 430. Flip-flops 330, 340, and 350, being positive edge triggered, do not change signals IN2, IN1, or IN0 so that ramping down is still at the maximum ramp rate.

Ramping down continues until time 440 which is after sense circuit 240 senses that the selected memory cell has tripped again and when flip-flop 310 asserts signal UP to begin ramping up voltage VG. Flip-flop 320 asserts signal CNT at time 440 which triggers flip-flops 330, 340, and 350. Flip-flops 330 has its data input coupled to a supply voltage Vcc and when triggered deasserts signal IN2. Deasserting signal IN2 causes word line driver 260 to reduce the ramping rate. Signals IN1 and IN0 remain asserted at time 440 because signals at data input terminals of flip-flops are low. At time 450 which is the next edge of signal CLK, word line driver 260 is still ramping up voltage VG, and the selected memory cell does not conduct. Signal CLK triggers flip-flop 320 which deasserts signal CNT because signal UP changed at time 440.

Sense circuit 240 next senses that the selected memory cell trips at time 455; and at time 460, flip-flop 310 changes signal UP. Ramping down begins at the same rate as the previous ramping up stage because signals IN2, IN1, and IN0 do not change at time 460. Flip-flop 320 does not change signal CNT until time 470, the edge of signal CLK following the change in signal UP. At time 470, flip-flop 340 deasserts signal IN1, and the ramping rate falls.

For the timing diagram of FIG. 4, each stage of the read process ends at an edge of signal CLK following sense circuit 240 sensing that the selected memory cell has tripped. The ramping rate decreases one cycle of signal CLK after the beginning of each stage (except the first stage) until all of signals IN2, IN1, and IN0 are deasserted after which only pull-up circuit 261 or pull-down circuit 265 control gate voltage VG. Pull-up circuit 261 and pull-down circuit 265 may be designed to provide and draw only a minimal current which keeps gate voltage VG near the level found at the end of the stage in which signal IN0 was deasserted. In this way, if the total read time for each read is constant, the read voltage is retained for cases where the search process quickly converges on the voltage to be read. If desired, a filter extracts an average value from voltage VG while voltage VG oscillates around the trip point.

Figure 5:
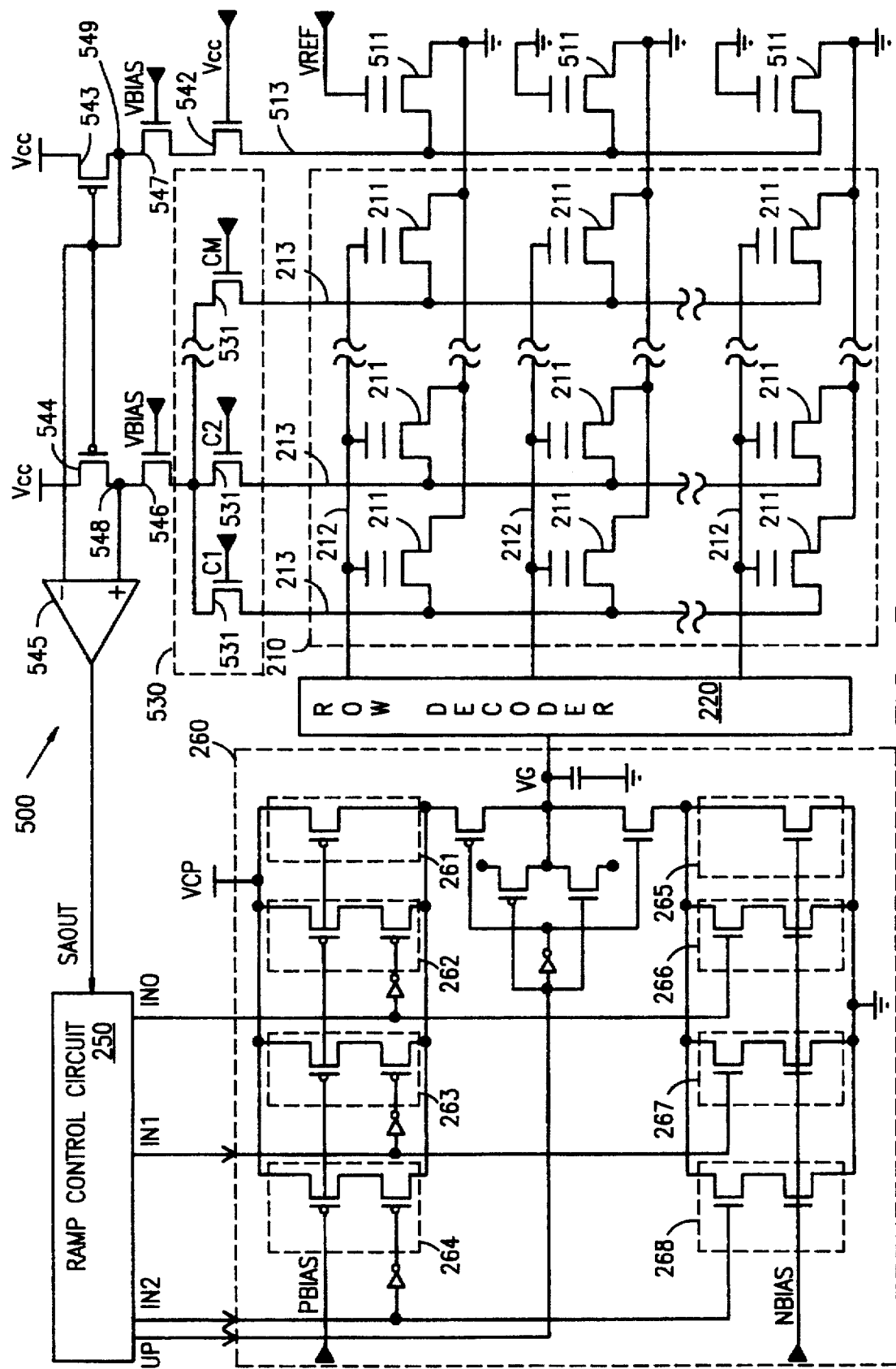
FIGS. 5 and 6 shows portions of other memories in accordance with embodiments of the invention.

A sample-and-hold circuit 290 holds voltage VG found at the end of the read process. This voltage depends on the trigger point sensed by sense circuit 240 and may differ somewhat from the threshold voltage of the selected cell. FIG. 5 shows an example memory 500 which illustrates the difference between the threshold voltage and the trip point of a memory cell. Memory 500 contains an array 210 of memory cells 211, a row decoder 220, a word line driver 260, and a ramp control circuit 250 which operate as described above in regard to FIG. 2. The sense circuit in memory 500 includes an amplifier 545, a reference cell 511, and transistors 542, 543, 544, 546 and 547 which forms a circuit such that at the trip point a current through the selected memory cell is equal to a current through reference cell 511.

Reference cell 511 is structurally identical to memory cells 211 and is part of a row of reference cells. The reference cells may be formed in the same area as array 210 and with the same spacing as memory cells 211 so that the reference cells are subject to substantially the same process variations as are memory cells 211. The reference cells differ from memory cells 211 in that the control gates of the reference cells are not coupled to word lines 212, and a bit line 513 which connects to the drains of the reference cells is not selectable by column decoder 530.

During a read of a selected memory cell, a reference voltage VREF which is slightly greater than the threshold voltage of reference cell 511 is applied to the control gate of reference cell 511, and a drain voltage is applied to the bit line connected to the drain of the reference cell so that a current flows through reference cell 511. Preferably the current is small on the order of 1 μA for a typical analog memory cell structure. A cascading device 547 which has a gate voltage fixed by a second reference VBIAS may be used to control the drain voltage. VBIAS would typically be about 2 volts to limit the drain voltage and prevent read disturb of reference cells 511. Transistor 542 is turned on to apply the drain voltage to the reference cell 511.

At the trip point, the current through reference cell 511 is equal to the current through the selected memory cell. To accomplish this, a current mirror is created using a transistor 543 connected in series with transistors 542 and 547 and reference cell 511. The gate and drain of transistor 543 are coupled to the gate of a transistor 544 which is connected in series with a cascading device 546, a transistor 531 which is turned on inside a column decoder 530, and the selected memory cell. Transistor 544 is identical to transistor 543. Cascoding devices 546 and 547 are identical and have the same gate voltage (VBIAS), and transistor 542 is identical to the transistor 531 which is turned on in column decoder to connect the sense circuit to the selected cell.

Amplifier 545 is connected to nodes in both sides of the current mirror. When the current through the selected memory cell is not equal to the current through reference cell 511, the current mirror is unbalanced. For example, if the selected memory cell conducts less current than reference cell 511, voltages at a positive input terminal 544 of amplifier 545 is higher than voltage at a negative input terminal 549 of amplifier 545, and amplifier 545 drives signal SAOUT high. If the selected memory cell conducts more current than reference cell 511, voltages at positive input terminal 548 is lower than voltage at negative input terminal 549, and amplifier 545 deasserts signal SAOUT.

The trip point of the sense circuit of FIG. 5 is the point where currents are equal. At the trip point, word line voltage VG for the selected memory cell is greater than the threshold voltage of the selected memory cell by the same amount that reference voltage VREF is greater than the threshold voltage of reference cell 511. Typically, voltage VG being different from the threshold voltage is unimportant because during reading the relative threshold voltages of the memory cells, rather than the absolute threshold voltages, indicate the values stored in the memory cells, and voltage VG indicates the relative threshold voltage.

Figure 6:
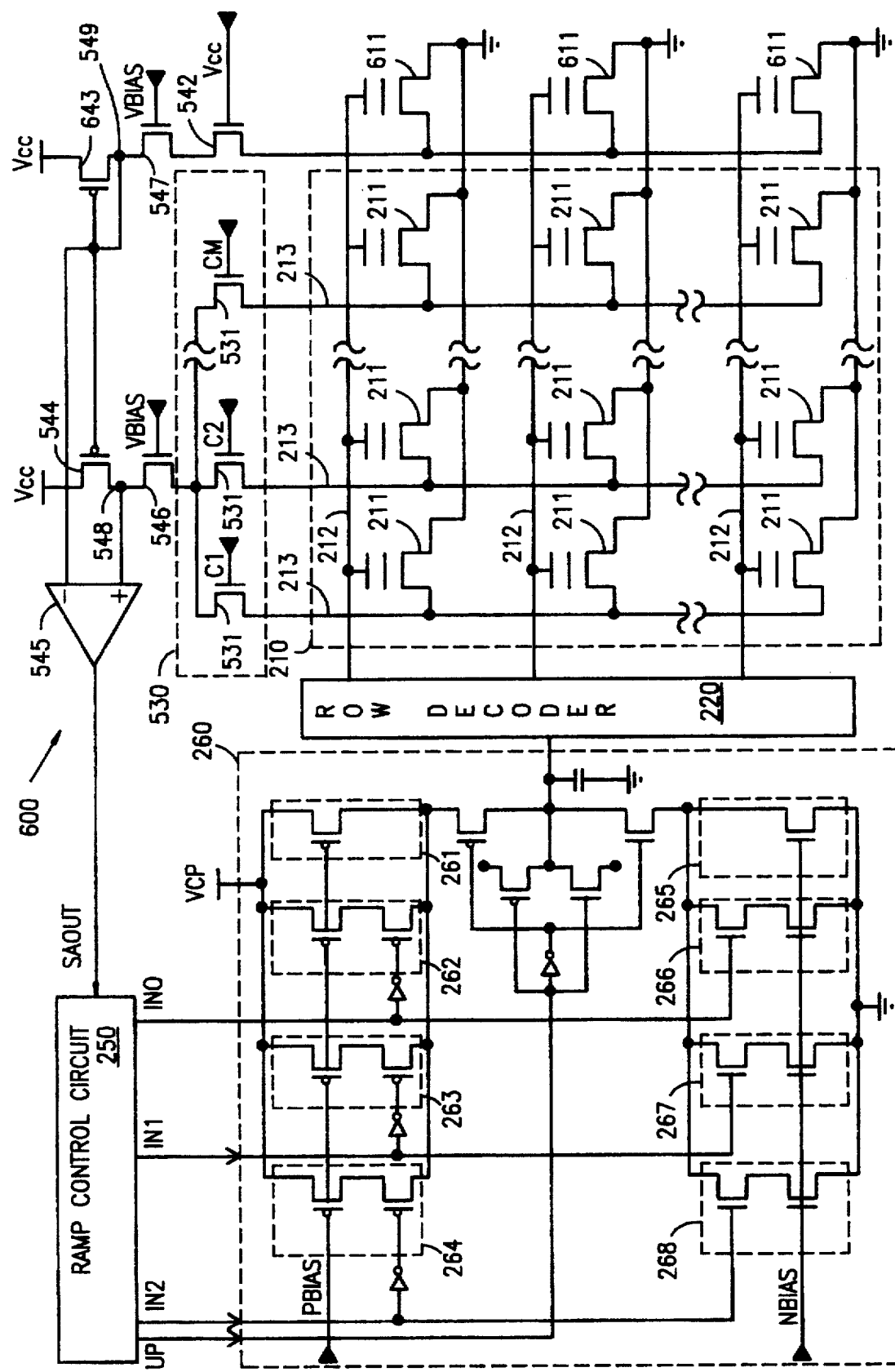

FIG. 6 shows a memory 600 including reference cells 611 having control gates connected to word lines 212. In accordance with one embodiment of the invention, reference cells 611 are unprogrammed, i.e. have the lowest possible threshold voltage. During a read, word line driver 260 applies gate voltage VG to both the selected memory cell and to a reference cell 611 in the same row as the selected memory cell. When ramping up voltage VG, the reference cell begins to conduct before the selected memory cell begins to conduct unless the selected memory cell also has the lowest threshold voltage. Voltage on positive input terminal 548 is near supply voltage Vcc when the selected memory cell does not conduct, and voltage at negative input terminal 549 is lower because a current passes through transistor 643. Amplifier 545 provides a high output when transistor 211 does not conduct.

When voltage VG nears the threshold voltage of the selected memory cell, the selected memory cell begins to conduct and the voltage at positive input terminal 548 drops. Voltage at negative input terminal 549 also drops because the conducting reference cell conducts more current as voltage VG increases. However, transistor 643 is bigger (e.g. has a larger channel width) than transistor 544 so that the increase in current through the selected memory cell causes voltage on the positive input terminal 548 to drop faster than the voltage on the negative input terminal 549 when the selected memory cell begins to conduct. When ramping down voltage VG, the selected memory cell begins to turn off, and voltage at positive input terminal 548 rises faster than voltage at negative input terminal 549.

In the memory 600, current through a memory cell at the trip point for the memory cell depends on the threshold voltage of the memory cell. When higher threshold voltage memory cells are read, higher currents flow through both the reference cell and the selected memory cell because voltage VG provides greater overdrive to the reference cell. Accordingly, the difference between the trip point and the threshold voltage for a cell increases with higher threshold voltages. This make determination of the absolute threshold voltage more difficult, but voltage VG still provides an accurate measure of the relative threshold voltages of memory cells. An advantage of memory 600 is that reference cells can more easily be made as part of array 210 without the need to isolate the control gates of the reference cells or provide reference voltage for the control gates of the reference cells. Additionally, extra decode circuitry is not required to select a reference in the same row as the cell being read.

Although the present invention has been described with reference to particular embodiments, the description is only an example of the invention's application and should not be taken as a limitation. Various adaptations and combinations of features of the embodiments disclosed are within the scope of the present invention as defined by the following claims.

We claim:

1. A read circuit comprising:
    a driver which is operable in a first mode to ramp up an output voltage which is applied to a gate in a selected memory cell during a read process and operable in a second mode to ramp down the output voltage which is applied to the gate in the selected memory cell during the read process;
    a sense circuit which generates a first signal indicating whether the selected memory cell conducts a first current; and
    a control circuit coupled to the sense circuit and the driver, wherein during the read process, the control circuit switches the driver between the first mode and second mode in response to changes in the first signal from the sense circuit.

2. The read circuit of claim 1, further comprising a sample-and-hold circuit coupled to sample the output voltage of the driver, wherein a sample taken by the sample-and-hold circuit indicates a value read by the read circuit.

3. The read circuit of claim 1, wherein:
    the driver comprises circuitry for ramping the output voltage at different rates; and
    the control circuit comprises circuitry for selecting that the driver ramp the output voltage at a first rate during a stage in a read process and ramp the output voltage at a second rate at an end of the read process, the second rate being lower than the first rate.

4. The read circuit of claim 3, further comprising a sample-and-hold circuit coupled to sample the output voltage of the driver at the end of the read process, wherein a sample taken by the sample-and-hold circuit indicates a value read by the read circuit.

5. The read circuit of claim 1, wherein the driver comprises:
    a first plurality of loads coupled to a voltage source;
    a second plurality of loads coupled to ground;
    a capacitor coupled to an output terminal which provides the output voltage; and
    selection circuitry which connects selected loads from the first and second pluralities to the output terminal, wherein a rate and direction of ramping of the output voltage depends on which loads are connected to the output terminal.

6. The read circuit of claim 1, further comprising a row decoder coupled between the driver and an array of memory cells, and a column decoder coupled between the sense circuitry and the array.

7. The read circuit of claim 1, wherein the sense circuit comprises:
    a reference cell which is structurally identical to the selected memory cell;
    a first bias circuit which biases the reference cell to conduct a reference current, the first bias circuit containing a first node;
    a second bias circuit which biases a source and a drain in the selected memory cell so that when the selected memory cell conducts the first current, a voltage on a second node in the second bias circuit is equal to a voltage on the first node in the first bias circuit; and
    a differential amplifier having a first input terminal coupled to the first node and a second input terminal coupled to the second node, wherein the differential amplifier generates the first signal.

8. The read circuit of claim 7, wherein:
    the first bias circuit comprises a first transistor coupled between a supply voltage and a current carrying terminal of the reference cell; and
    the second bias circuit comprises a second transistor coupled between the supply voltage and a current carrying terminal of the selected memory cell, wherein a gate and drain of the first transistor are coupled to each other and to a gate of the second transistor to form a current mirror.

9. The read circuit of claim 8, wherein:
    the first bias circuit further comprises a reference voltage generator which applies a reference voltage to a gate of the reference cell;
    the first transistor is structurally identical to the second transistor; and
    the first current is equal to the reference current.

10. The read circuit of claim 8, wherein:
    the output voltage of the driver is applied to a gate of the reference cell;
    the reference cell has a threshold voltage that is at least as low as a lowest possible threshold voltage for the selected cell;
    the first transistor is larger than the second transistor; and
    the first current is smaller that the reference current.

11. A memory comprising:
    an array of memory cells which includes word lines and bit lines, each word line being coupled to control gates of a row of memory cells in the array, each bit line being coupled to a column of memory cells in the array;
    a driver which is operable in a first mode to ramp up a voltage on a selected word line during a read process and operable in a second mode to ramp down the voltage on the selected word line during the read process;
    a sense circuit which generates a sense signal indicating whether a selected bit line conducts a first current; and a control circuit coupled to the sense circuit and the driver, wherein during the read process, the control circuit switches the driver between the first mode and second mode in response to changes in the sense signal.

12. The memory of claim 11, wherein:

the driver comprises circuitry for ramping the voltage on the selected word line, at different rates; and the control circuit comprises circuitry for selecting that the driver ramp the output voltage at a first rate during a stage of the read process and ramp the output voltage at a second rate at an end of the read process, the second rate being lower than the first rate.

13. The memory of claim 12, further comprising a sample-and-hold circuit coupled to sample the voltage from the driver, wherein a sample taken at the end of the read process, by the sample-and-hold circuit indicates a value read by the read circuit.

14. The memory of claim 11, further comprising:

a row decoder coupled between the driver and the word lines, wherein during the read process, the row decoder connects the driver to the selected word line; and a column decoder coupled between the sense circuitry and the bit lines, wherein during the read process, the column decoder connects the sense circuit to a selected bit line.

15. The memory of claim 11, wherein the memory stores analog values, each analog value being indicated by a threshold voltage of a memory cell in the array.

16. The memory of claim 11, wherein the memory stores digital values, wherein a threshold voltage of a memory cell in the array indicates multiple bits for a stored digital value.

17. The memory of claim 11, wherein the sense circuit comprises:

a reference column which is in the array and contains memory cells having a lowest possible threshold voltage for memory cells in the array;

a first bias circuit which during the read process is connected to a bit line for the reference column;

a second bias circuit which during the read process is connected to the selected bit line; and a differential amplifier having a first input terminal and a second terminal respectively coupled to a first node in the first bias circuit and a second node in the second bias circuit, wherein the differential amplifier generates the sense signal.

18. The memory of claim 17, wherein:

the first bias circuit comprises a first transistor coupled between a supply voltage and the bit line for the reference column; and the second bias circuit comprises a second transistor coupled between the supply voltage and the selected bit line, wherein a gate and drain of the first transistor are coupled to each other and to a gate of the second transistor so that current on the bit line for the reference column controls the conductivity of the second transistor.

19. The memory of claim 18, wherein the first transistor is larger than the second transistor.

20. A method for reading a memory cell, the method comprising:

executing a series of stages including a first stage and a last stage, wherein each stage comprises:

changing a gate voltage applied to the memory cell; and ending the stage after changing of the gate voltage causes the memory cell to trip, wherein for each stage except the first stage, a direction selected for changing the gate voltage during the stage is opposite to a direction selected for changing the gate voltage during a preceding stage;

sampling the gate voltage after the last stage; and determining from a sampled gate voltage a value read from the memory cell.

21. The method of claim 20, wherein a rate of change in the gate voltage during the last stage is less than a rate of change in the gate voltage during the first stage.

22. The method of claim 20, wherein determining the value read comprises determining an analog value.

23. The method of claim 20, wherein determining the value read comprises determining a multi-bit digital value represented by the sampled gate voltage.

24. The method of claim 20, further comprising:

precharging the gate voltage of the selected memory cell to an initial level;

sensing whether the initial level of the gate voltage causes the selected memory cell to conduct; and selecting a direction for changing the gate voltage during the first stage, wherein the direction selected for the first stage is determined by whether the initial level of the gate voltage causes the selected memory cell to conduct.

25. The method of claim 24, wherein the initial level is a voltage which is the median of a range of possible threshold voltages for the selected memory cell.

* * * * *